United States Patent [19]
Tsukamoto

[11] Patent Number: 5,640,052
[45] Date of Patent: Jun. 17, 1997

[54] INTERCONNECTION STRUCTURE OF ELECTRONIC PARTS

[75] Inventor: Kenji Tsukamoto, Tokyo, Japan

[73] Assignee: NEC Corporation, Tokyo, Japan

[21] Appl. No.: 642,410

[22] Filed: May 3, 1996

Related U.S. Application Data

[63] Continuation of Ser. No. 207,683, Mar. 9, 1994, abandoned.

[30] Foreign Application Priority Data

Mar. 10, 1993 [JP] Japan ................. 5-049172

[51] Int. Cl.$^6$ ................. H01L 23/48; H01L 23/52
[52] U.S. Cl. ................. 257/781; 257/738; 257/778; 257/780
[58] Field of Search ................. 257/737, 738, 257/778, 780, 781

[56] References Cited

U.S. PATENT DOCUMENTS

| | | | |
|---|---|---|---|
| 3,470,611 | 10/1969 | McIver et al. | 257/781 |
| 3,488,840 | 1/1970 | Hymes et al. | 257/781 |
| 3,921,285 | 11/1975 | Krall | 257/781 |
| 4,545,610 | 10/1985 | Lakritz et al. | 257/781 |
| 4,818,728 | 4/1989 | Rai et al. | 437/209 |
| 4,845,542 | 7/1989 | Bezuk et al. | 257/737 |
| 4,970,570 | 11/1990 | Agarwala et al. | 257/780 |

FOREIGN PATENT DOCUMENTS

| | | |
|---|---|---|
| 0084464 | 7/1983 | European Pat. Off. . |
| 0270067 | 6/1988 | European Pat. Off. . |
| 0480754 | 4/1992 | European Pat. Off. . |
| 2622741 | 5/1989 | France . |

OTHER PUBLICATIONS

Patent Abstracts of Japan, vol. 9, No. 189, 6 Aug. 1985.
Patent Abstracts of Japan, vol. 16, No. 79, 26 Feb. 1992.
Patent Abstracts of Japan, vol. 10, No. 213, 25 Jul. 1986.
IEICE Transactions, vol. E74, No. 8, Aug. 1991, pp. 2323–2330, Toshio Sudo et al., "A silicon–based mutichip module with co–fired aluminum nitride package".
Electronic Packaging and Production, vol. 31, No. 10, Oct. 1991, pp. 40–45, Howard W. Markstein, "Multichip modules pursue wafer scale performance".
Matsui et al. "VLSI Chip Interconnection Technology Using Stacked Solder Bumps", Proc. IEEE 37th Electronic Components Conference, pp. 573–578. no date.

Primary Examiner—Sara W. Crane
Assistant Examiner—David Ostrowski
Attorney, Agent, or Firm—Sughrue, Mion, Zinn, Macpeak & Seas

[57] ABSTRACT

An interconnection structure is provided which is simple in structure and is easily manufactured and in which stress generated in solder bumps is minimized. Pads of a semiconductor chip and pads of a substrate are connected to each other by solder bumps. The solder bumps are hourglass-shaped. Metal core members are provided in the solder bumps, respectively. The core member is constituted with a circular bottom portion and a circular pin portion. The core member is soldered to the pad of the semiconductor chip by solder.

9 Claims, 6 Drawing Sheets

|  | YOUNG'S MODULUS (kg/mm²) | POISSON RATIO | COEFFICIENT OF LINEAR EXPANSION (1/°C) |
|---|---|---|---|
| SEMICONDUCTOR CHIP 1 | 17300 | 0.346 | 3.0 e-5 |
| SUBSTRATE 2 | 13600 | 0.238 | 4.2 e-6 |
| BUMP 3 | 3060 | 0.3 | 27.0 e-6 |
| CORE MEMBER 4 | 8400 | 0.1367 | 19.1 e-6 |
| PAD 5,6 | 13200 | 0.343 | 16.7 e-6 |
| ORGANIC INSULATING LAYER 8 | 600 | 0.23 | 20.0 e-6 |

FIG. 5c

|  | (i) BARREL-SHAPED SOLDER BUMP | (ii) HOURGLASS SHAPED NO CORE | (iii) ONLY CORE | (iv) HOURGLASS SHAPED HAVING CORE |
|---|---|---|---|---|
| CROSS SECTION | MAX. | MAX. | MAX. | MAX. |
| STRESS RATIO | 1 | 0.62 | 0.63 | 0.51 |

INTERCONNECTION STRUCTURE OF ELECTRONIC PARTS

This is a Continuation of Application Ser. No. 08/207,683 filed Mar. 9, 1994 now abandoned.

BACKGROUND OF THE INVENTION

The present invention relates to an interconnection structure of electronic parts and, particularly, to an interconnection structure of electronic parts using solder bumps.

By using an interconnection technology using solder bumps, a number of connection terminals can be interconnected at once. Therefore, such technology is suitable for interconnecting electronic parts each having a number of connection terminals and has been used widely in interconnecting LSI chips having, for example, several hundred of connecting terminals.

It has been known that, in a case where a bare-chip is connected to a substrate by using solder bumps, faults in connecting portions occur frequently. Bare-chip is an LSI chip not covered with insulating material. The reason for such faults is a difference in thermal expansion coefficient between the LSI chip and the substrate on which the LSI chip is mounted. The LSI chip generates heat during its operation, because of which the LSI chip and the substrate mounting the chip are expanded. Since their thermal expansion coefficients are different, stress is generated in the solder bumps interconnecting the LSI chip and the substrate. This stress is generated during operation of the LSI chip and disappears when the chip is inoperative. Therefore, generation of stress in the solder bumps is repeated, with which fatigue of the solder bumps occurs, leading to destruction thereof. As a result, the connecting portion or portions between the LSI chip and the substrate break.

An example of a technique for preventing such faults of the interconnection structure is disclosed in N. Matsui, et al. "VLSI CHIP INTERCONNECTION TECHNOLOGY USING STACKED SOLDER BUMPS", pp. 573 to 578, Proc. IEEE 37th Electronic Components Conf. In the technique disclosed in this article, stress in the solder bumps is reduced by stacking a plurality of solder bumps.

In this technique, however, the structure of the solder bumps is very complicated and difficult to manufacture.

SUMMARY OF THE INVENTION

An object of the present invention is to provide an interconnection structure of electronic parts which is simple in structure and manufacture and in which stress generated in solder bumps is minimized.

In order to achieve the above object, each of the solder bumps constituting the interconnection structure is provided-therein with a core member of metal.

In an embodiment of the present invention, each solder bump having the core member is hourglass-shaped.

In another embodiment of the present invention, the core member has a configuration which is variable according to the specific application thereof.

According to another aspect of the present invention, an interconnection method for interconnecting electronic parts is provided, which comprises the first step of mounting a core member on each pad of a first electronic part, the second step of painting each pad of a second electronic part with a predetermined amount of solder paste, the third step of burying the core member in the solder paste and the fourth step of heating and melting the solder paste, cooling and solidifying it. The amount of solder paste, in this method, is determined such that, when melted in the fourth step, the solder paste provides an hourglass-shape by surface tension.

According to a further aspect of the present invention, an interconnection method for interconnecting electronic parts is provided, which comprises the first step of mounting a core member on each pad of a first electronic part, the second step of inserting an annular shaped solder into the core member, the third step of positioning the first electronic part on a second electronic part such that the core members are aligned with the respective pads of the second electronic part and the fourth step of heating and melting the annular solders, cooling and solidifying them. An amount of solder forming each annular solder, in this method, is determined such that, when melted in the fourth step, the solder provides an hourglass-shape by surface tension.

A semiconductor device to be interconnected by using the interconnection structure according to the present invention includes an LSI bare-chip and core members mounted on pads of the LSI bare-chip. Each core member is given an amount of solder material which is enough to form an hourglass-shaped solder bump when reflown.

BRIEF DESCRIPTION OF THE DRAWINGS

Other objects, features and advantages of the present invention will become more apparent when the following description is read in conjunction with the accompanying drawings, wherein

FIG. 2(a)–(c) shows a structure of a core member 4 in more detail;

FIGS. 3 and 4(a)–(c) show a method of manufacturing the interconnection structure of electronic parts according to the first embodiment of the present invention;

FIG. 6(a)–(f) shows a structure of a core member 4 according to a second embodiment of the present invention;

FIG. 7(a)–(c) shows a method of manufacturing the interconnection structure for electronic parts, according to a third embodiment of the present invention;

In these figures, the same reference numerals depict the same constructive components, respectively.

EMBODIMENT

[First Embodiment]

A first embodiment of the present invention will be described with reference to FIG. 1.

Figure 1:
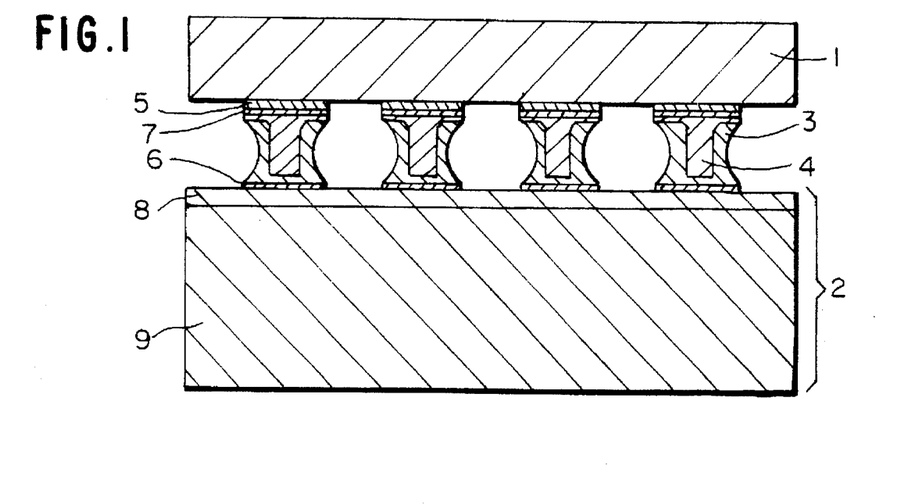
FIG. 1 shows an interconnection structure for electronic parts, according to a first embodiment of the present invention.

Referring to FIG. 1, in an interconnection structure for electronic parts according to this embodiment, a semiconductor chip 1 and a substrate 2 are interconnected by solder bumps 3.

The semiconductor chip 1 is an LSI bare-chip. On one surface of the semiconductor chip 1, a plurality of pads 5 are provided. These pads 5 are arranged in matrix. Each pad 5 is constituted with laminated circular metal layers each having diameter of 0.1 mm.

The substrate 2 includes a ceramic substrate 9 of mainly almina and an organic insulating layer 8 provided on the ceramic substrate 9. The organic insulating layer 8 is provided on a surface of the ceramic substrate 9 which faces to the semiconductor chip 1. On the organic insulating layer 8, a plurality of pads 6 are arranged in matrix. The pads 6 on the organic insulating layer 8 correspond, in position, to the pads 5 on the semiconductor chip 1, respectively. Each pad 6 is constituted with laminated circular metal layers each having a diameter of 0.1 mm.

The solder bumps 3 interconnect the pads 5 of the semiconductor chip 1 and the pads 6 of the substrate 2 electrically and mechanically, respectively. Each solder bump 3 is hourglass-shaped.

A core member 4 is provided in each solder bump 3. The core member 4 is mounted on each pad 5 of the semiconductor chip 1 by a solder 7. The solder 7 interconnects the pad 5 of the semiconductor chip 1 and the core member 4 electrically and mechanically. Melting point of the solder 7 is higher than that of a solder 10 forming the solder bump 3.

Configurations of the solder bump 3 and the core member 4 will be described in detail referring to FIG. 2 (a)~(c). FIG. 2 (a)~(c) shows the approximate configuration of the core member 4. The exact size of each portion of core member 4 is indicated by figures therein.

Figure 2A:
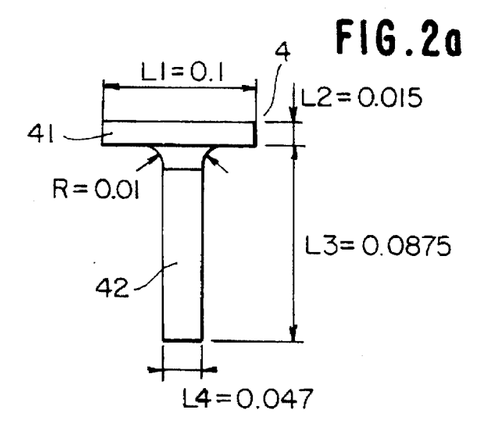

Referring to FIG. 2(a), the core member 4 is constituted with a circular bottom portion 41 and a circular pin portion 42. The bottom portion 41 and the pin portion 42 are formed integrally. A diameter L1 of the bottom portion 41 is 0.1 mm and a thickness L2 thereof is 0.015 mm. Height L3 of the pin portion 42 is 0.0875 mm and diameter L4 thereof is 0.047 mm. A vertical cross section of a portion connecting the bottom portion 41 and the pin portion 42 is rounded with radius R=0.01 mm.

Figure 2B:
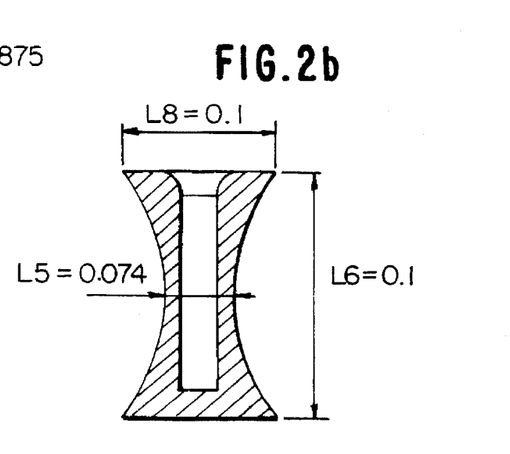

Referring to FIG. 2(b), diameter L8 of the upper and lower ends of the solder bump 3 is 0.1 mm, and diameter L5 of an intermediate portion of the solder bump 3 is 0.074 mm. Height L6 of the solder bump 3 is 0.1 mm.

Figure 2C:
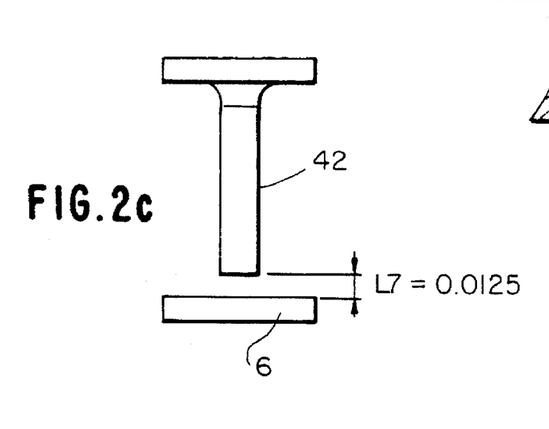

Referring to FIG. 2(c), distance L7 between a lower end of the pin portion 42 and an upper surface of the pad 6 is 0.0125 mm.

Dimensions of the respective portions of the core member 4 mentioned above may be changed within suitable ranges, respectively. Height L3 of the pin portion 42 can be changed within a range from 0.05 mm to 0.1 mm, diameter L4 of the pin portion 42 can be changed within a range from 0.02 mm to 0.08 mm. Distance L7 between the lower end of the pin portion 42 and the upper surface of the pad 6 can be changed in a range from 0.01 mm to 0.02 mm. Dimensions of the respective portions of the core member 4 should be set to values suitable for forming the solder bump 3. Describing this in detail, the dimensions of the respective portions of the core member 4 must be determined such that the solder bump 3, when melted, becomes hourglass-shaped naturally by surface tension thereof. Therefore, the dimensions of the respective portions of the core member 4 depend upon properties of the solder 10 forming the solder bump 3.

Materials of the respective portions shown in FIG. 1 will be described.

The pads 5 and 6 are of gold or copper.

An example of material of the solder 7 is gold-tin solder, whose melting point is higher than that of the solder 10 forming the solder bump 3.

The core member 4 preferably satisfies the following two conditions. The first condition is that the thermal expansion coefficient of the material is smaller than that of the solder 10 forming the solder bump 3. It has been found by simulation that stress exerted on the connecting portion is reduced when the material of the core member 4 satisfies this condition. Materials satisfying this condition include gold, silver, copper alloys, KOVAR, etc.

The second condition is that the Young's modulus of the material is as great as possible. The first condition has priority over the second one. In other words, manufacturers applying this embodiment should adopt the material that has biggest Young's modulus among the materials satisfying the first condition.

An example of the material of the solder 10 forming the solder bump 3 is eutectic solder material of tin and lead. The solder 10 must have melting point lower than that of the solder 7.

Suitable combinations of materials of various components mentioned above will be described.

When the material of the pad 5 is gold, the solder 7 is preferably a gold-tin solder. With this combination of materials, wettability of the solder 7 is improved.

When the core member 4 is of gold or silver, the solder 10 forming the solder bump 3 is preferably a tin-lead eutectic solder. This is because the thermal expansion coefficient of the core member 4 becomes smaller than that of the solder bump 3.

When the core member 4 is of gold or silver and the solder 10 is of a tin-lead eutectic solder, the core member 4 is preferably plated with copper in order to prevent gold or silver from diffusing into the solder 10.

A method of forming the interconnection structure shown in FIG. 1 will be described with reference to FIGS. 3 and 4.

Figure 3:
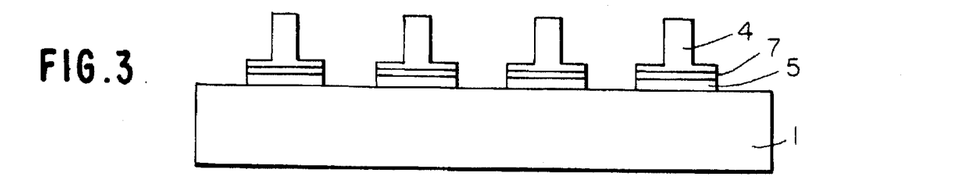

In the first step shown in FIG. 3, the core members 4 are mounted on the pads 5 of the semiconductor chip 1 by reflowing the solder 7 painted on the pads 5. If necessary, the core members 4 are preliminarily plated with suitable material. This reflow-soldering is preferably performed without using flux so that fault of the semiconductor chip 1 caused by flux are prevented. The reflow-soldering without flux can be done in an atmospheric gas such as nitrogen, and argon.

Figure 4A:
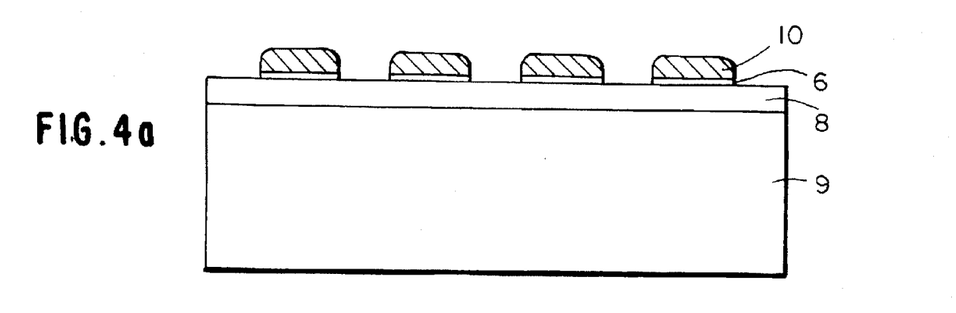

In the second step shown in FIG. 4(a), the pads 6 on the substrate 2 are painted with the solder 10 by using screen printing. An amount of the solder 10 for each pad 6 is regulated such that the resultant solder bump 3, when melted, becomes an hourglass-shape.

An optimum amount of the solder 10 for each pad 6 depends upon the material of the solder 10 and dimensions of the respective portions of the core member 4. Particularly, surface tension of the solder 10 when melted is a basic factor to be used in determining the optimum amount of the solder 10. The optimum amount of the solder 10 is difficult to determine theoretically and is determined according to experiments. If the amount of the solder 10 is excessive, a resultant solder bump 3 becomes barrel-shaped and, if it is short, the upper portion of a resultant solder bump 3 becomes small relatively. It can be said qualitatively that the larger the diameter L4 of the pin portion 42 of the core member 4, the larger the amount of solder 10 required.

Figure 4B:
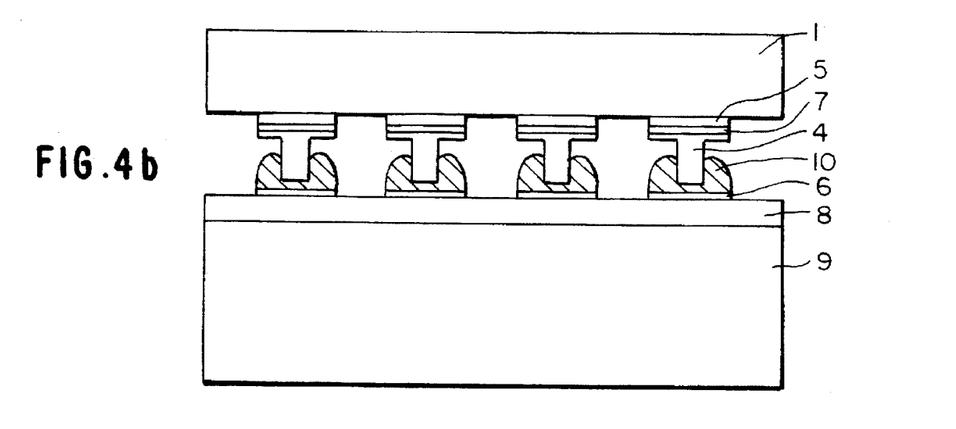

In the third step shown in FIG. 4(b), the core members 4 are inserted into the respective solders 10 while regulating the position of the semiconductor chip 1 with respect to the substrate 2 such that there is provided a predetermined distance between the lower ends of the pin portions of the core members 4 and the upper surfaces of the pads 6.

Figure 4C:
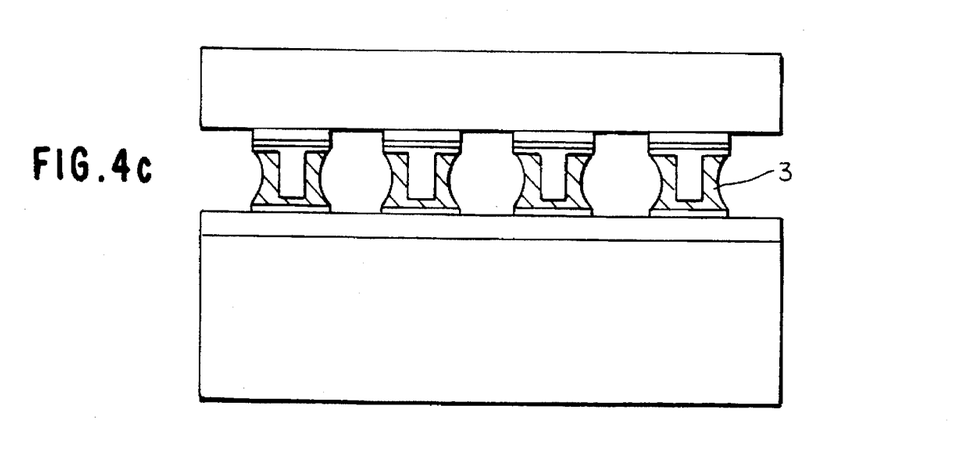

In the fourth step shown in FIG. 4(c), the solders 10 are reflown. First, the solders 10 are heated while maintaining the semiconductor chip 1 and the substrate 2 horizontally, to melt the solders. Each solder 10 in molten state is pulled up by the effect of surface tension and is shaped to an hourglass configuration. Thereafter, the solders 10 are cooled and solidified. The solidified solders 10 have hourglass configurations.

Now, a result of simulation performed to evaluate the effectiveness of this embodiment will be described with reference to FIG. 5.

Figure 5A:
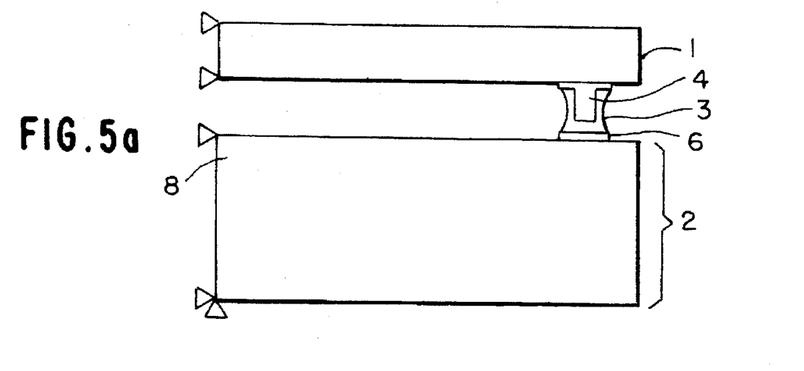
FIGS. 5(a) and 5(b) show a simulation setting condition for evaluating effectiveness of the interconnection structure according to the first embodiment of the present invention.
Figure 5B:
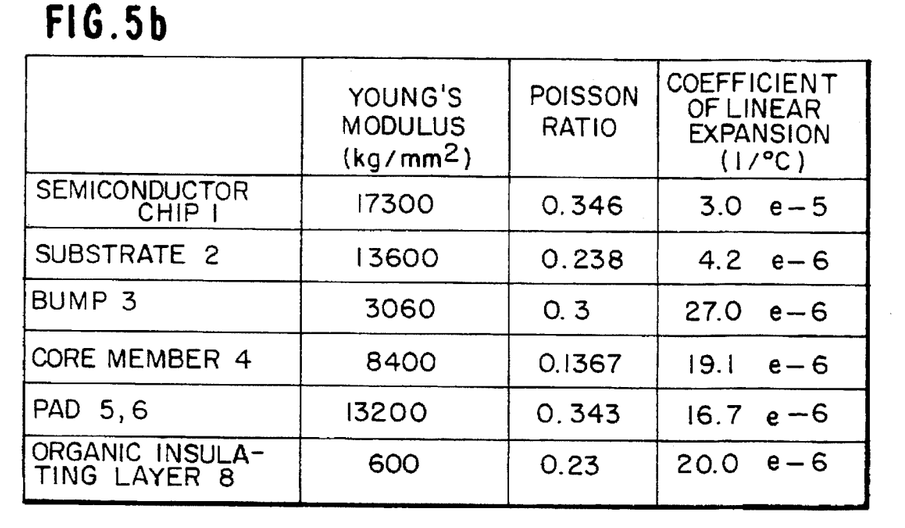
Figure 5C:
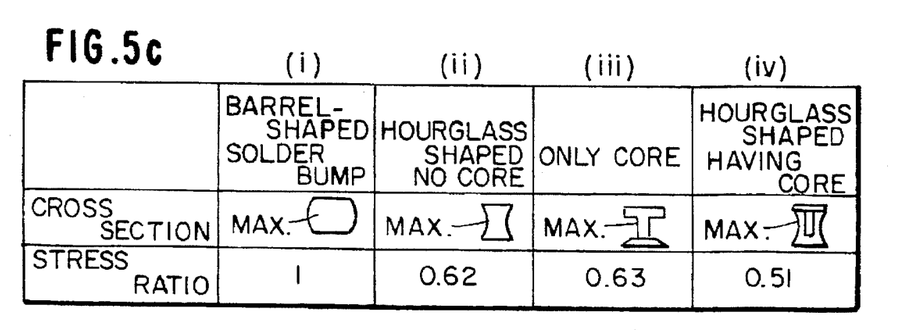
FIG. 5(c) shows a result of simulation for evaluating effectiveness of the interconnection structure according to the first embodiment of the present invention.

In this simulation, stress characteristics of a single solder bump 3 was simulated, as shown in FIG. 5(a). A position of the single solder bump 3 was set in around the outermost periphery of the substrate 2. Values of the respective members were set as shown in FIG. 5(b). Stress in the solder bump 3 was regarded as 0 at a temperature of 23° C. and stress in the solder bump 3 maintained at 125° C. was simulated according to the finite-element method under these conditions. For a comparison purpose of the characteristics, stress characteristics of the interconnection structures using solder bumps having different configurations from that of the solder bump 3 were also simulated. In more detail, (i) a barrel-shaped solder bump, (ii) an hourglass-shaped solder bump having no core member 4, (iii) only the core member 4 and (iv) the solder bump 3 of this embodiment were simulated, respectively. FIG. 5(c) shows a result of the simulation.

In FIG. 5(c), a portion of each solder bump in which maximum principal stress becomes maximum is indicated by max. This stress is referred to as maximum stress, hereinafter. The stress ratio, which is a ratio of maximum stress between the respective solder bump structures, is set to 1 for the solder bump structure (i). As a result, the stress ratio of the solder bump structure (ii) is 0.62 and that of the solder bump structure (iii) is 0.63. The stress ratio of the solder bump 3 of the present invention is 0.51. That is, it was proved that the stress acting on the solder bump 3 of this embodiment during a time period in which temperature rises is smaller compared with other solder bump structures.

In this embodiment, the core member 4 is provided in the solder bump 3 as mentioned. With such structure, it is possible to reduce stress generated in the solder bump during a time period in which temperature rises. Further, the interconnecting structure of this embodiment is simple in construction and can be easily manufactured.

[Second Embodiment]

A second embodiment of the present invention will be described with reference to FIG. 6. A feature of this embodiment resides in the structure of the core member 4.

FIGS. 6(a) to 6(f) show six different structures of the core member 4.

Figure 6A:
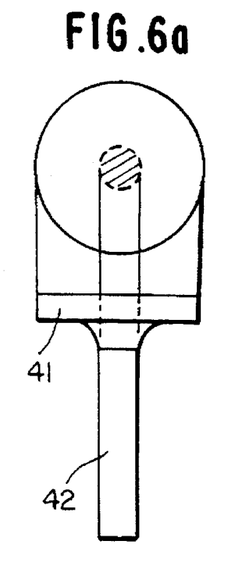

The structure shown in FIG. 6(a) is the structure of the core member 4 used in the first embodiment.

Figures 6B, 6E:
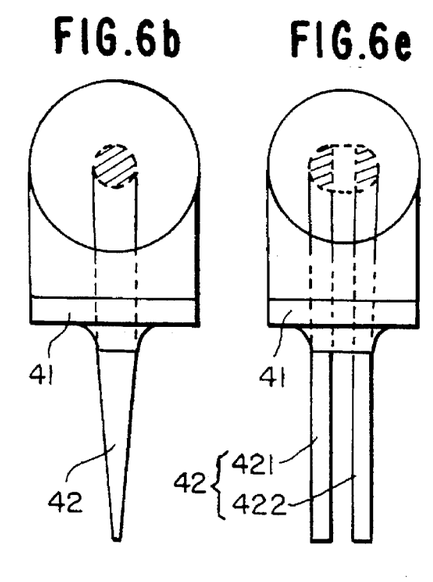

The structure shown in FIG. 6(b) has a pointed pin portion 42.

Figure 6C:
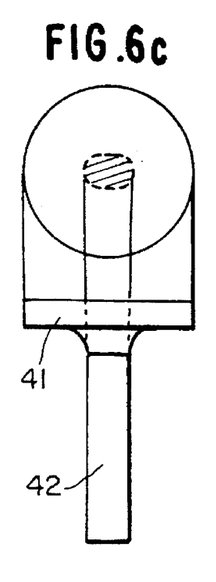

In the structure shown in FIG. 6(c), the pin portion 42 has a elliptic horizontal cross section. This structure is effective when applied to a case where an interval between adjacent pads 5 and hence adjacent pads 6 is small.

Figure 6D:
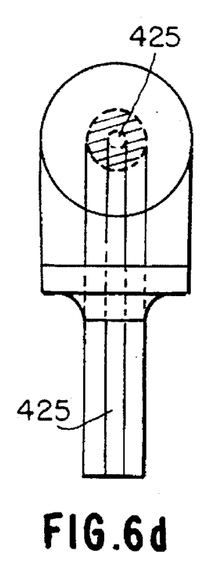

In the structure shown in FIG. 6(d), the pin portion 42 has a hole 425. In this structure, it is possible to provide a stronger connection than the structure shown in FIG. 6(a) since the solder 10 in molten state invades to the hole 425.

In the structure shown in FIG. 6(e), the pin portion 42 is constituted with a pin portion 421 and a pin portion 422 with a gap provided therebetween. In this structure, it is possible to provide a stronger connection than the structure shown in FIG. 6(a) since the solder 10 in molten state fills the gap.

Figure 6F:
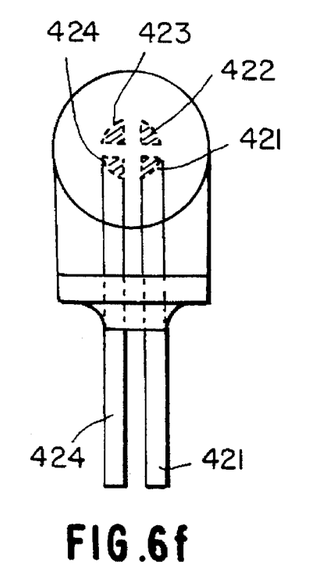

In the structure shown in FIG. 6(f), the pin portion 42 is constituted to four pin portions 421, 422, 423 and 424 with a gap being provided between adjacent ones of these pin portions. In this structure, it is possible to provide a stronger connection than the structure shown in FIG. 6(a) since the solder 10 in molten state fills these gaps.

In this embodiment, the core members 4 having various configurations are used. Selection of any one of these structures should be made according to the situation to which it is applied. It is possible to use any combination of these pin portion structures. For example, by combining the structures shown in FIG. 6(b) and FIG. 6(e), the pin portions 421 and 422 of the structure in FIG. 6(e) would be pinpointed, respectively.

[Third Embodiment]

A third embodiment of the present invention will be described with reference to FIG. 7. A feature of this embodiment resides in a method of forming the solder bump 3 which is used in the first embodiment.

The first step of this embodiment is the same as the first step in the first embodiment.

Figure 7A:
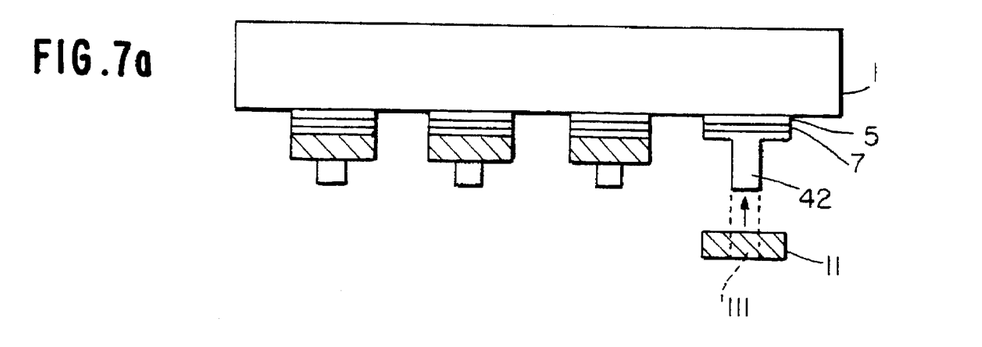

In the second step shown in FIG. 7(a), solder rings 11 are fitted on the pin portions 42 of the respective core members 4 by inserting the pin portions into center holes 111 of the solder rings 11. An amount of solder in the solder ring 11 is determined such that the solder ring 11, when melted, becomes an hourglass-shaped solder bump 3.

Figure 7B:
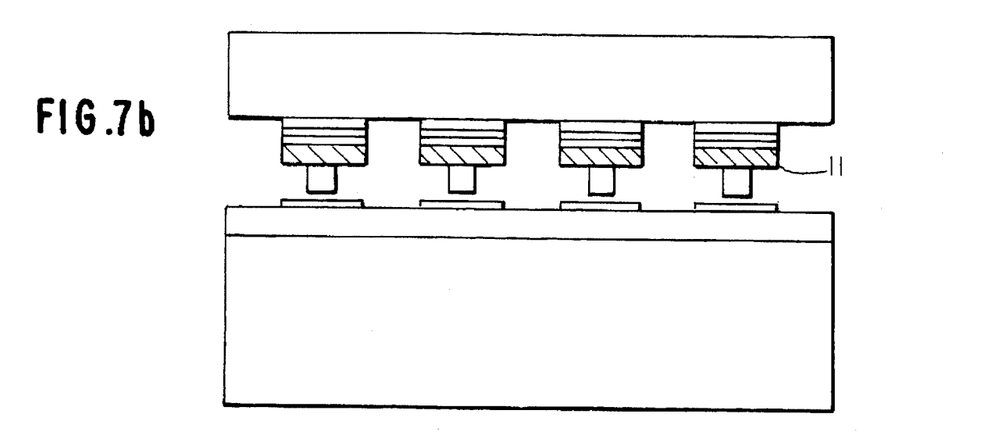

In the third step shown in FIG. 7(b), the semiconductor chip 1 is positioned on the substrate 2 and is aligned therewith with a predetermined gap between the top ends of the pin portions 42 and the upper surfaces of the pads 6.

Figure 7C:
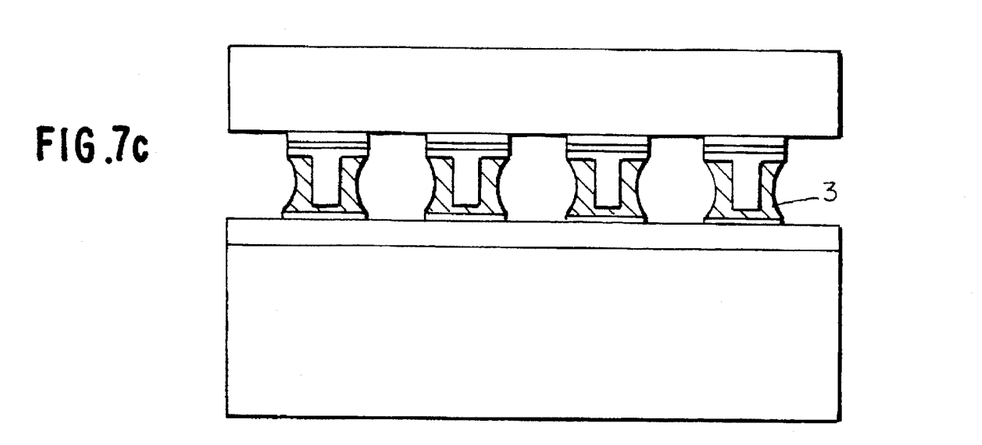

In the fourth step shown in FIG. 7(c), the solder rings 11 are reflown. This step is the same as the fourth step in the first embodiment. The solder bumps 3 having hourglass-shaped configurations are obtained after the fourth step.

In this embodiment, since the solder rings 11 each of an optimum amount of solder are fitted on the pin portions 42, respectively, there is no need to regulate the amount of solder to paint the pads 6. Further, the solder ring itself can be a commercial product. A purchaser is not required to regulate the amount of solder.

[Fourth Embodiment]

A fourth embodiment of the present invention will be described with reference to FIGS. 8 and 9. A feature of this embodiment resides in the structure of the substrate 2. In this embodiment, the core members 4 are provided on the pads 6 on the substrate 2.

Figure 8:
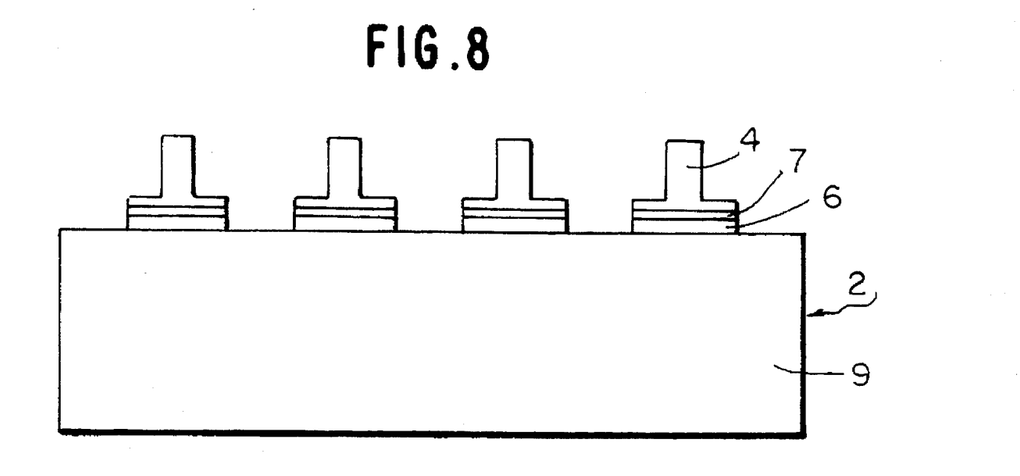
FIG. 8 shows a portion of an interconnection structure for electronic parts, according to a fourth embodiment of the present invention.

Referring to FIG. 8, the substrate 2 of this embodiment is constituted with only the ceramic substrate 9. On the upper surface of the ceramic substrate 9, the pads 6 are arranged and the core members 4 are mounted on the pads 6, respectively. The core member 4 is soldered to the pad 6 by the solder 7. Structures and materials of the pad 6, the solder 7 and the core member 4 are the same as those in the first embodiment, respectively.

Figure 9:
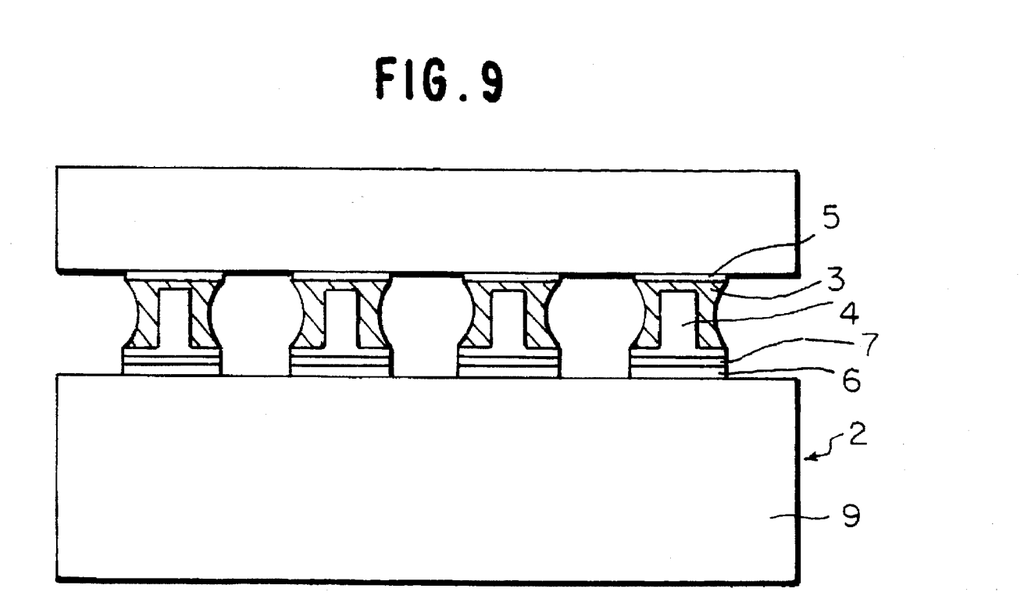
FIG. 9 shows the interconnection structure for electronic parts, according to the fourth embodiment of the present invention.

In a state where the semiconductor chip 1 and the substrate 2 are connected as shown in FIG. 9, the pads 5 and the pads 6 are connected by the solder bumps 3 each having an hourglass-shaped configuration.

In this embodiment, the core members 4 are provided on the substrate 2. The effects to be achieved by the fourth embodiment are the same as those achieved by the first embodiment.

[Other Embodiments]

A first feature of the present invention resides in that the core members 4 are provided in the solder bumps 3, respectively. A second feature of the present invention resides in that the core members 4 are provided in the hourglass-shaped solder bumps 3, respectively. A third feature of the present invention resides in that the solder bumps 3 are made hourglass-shaped by utilizing surface tension. Further, a fourth feature of the present invention resides in that the configuration of the core member 4 is changed according to its use. A fifth feature of the present invention resides in that the solder ring 11 is fitted on the pin portion 42 of the core member 4. A sixth feature of the present invention resides in that the core members 4 are provided on the substrate 2.

The present invention is featured by these features and can be embodied in various other manners than described. For example, it is possible to combine the features of the first to sixth embodiments. Further, the interconnection structure of the present invention can be used in other applications than the connection of the LSI bare-chip.

In the present invention, the amount of solder forming a solder bump and the configuration of a core member should be changed suitably according to the situation to which the present invention is applied. Further, the solder ring itself can be a commercial product. A purchaser is not required to regulate the amount of solder.

The scope of the present invention is indicated by the appended claims, but not restricted in any way by the text of the specification. Furthermore, all modifications and changes which come within the range of equivalency in the claims are intended to be embraced therein.

I claim:

1. An interconnection structure for electronic parts, comprising:

a plurality of hourglass-shaped solder bumps for electrically connecting a first electronic part to a second electronic part; and core members provided in said solder bumps, respectively, each of said core members comprising a pin portion having a tip portion, wherein said core members directly contact said first electronic part, said tip portion being spaced from said second electronic part, a solder bump being partially provided in said space between the tip portion and said second electronic part to provide an electrical connection therebetween.

2. The interconnection structure claimed in claim 1, wherein said first electronic part comprises an LSI bare-chip and said second electronic part comprises a substrate.

3. The interconnection structure claimed in claim 2, wherein said core members are provided on said LSI bare-chip.

4. The interconnection structure claimed in claim 1, wherein said first electronic part comprises a substrate, said second electronic part comprises an LSI bare-chip, and said core members are provided on said substrate.

5. The interconnection structure claimed in claim 1, wherein said pin portions of said core members are pin-pointed, respectively.

6. The interconnection structure claimed in claim 1, wherein said pin portions of said core members have elliptic cross sections, respectively.

7. The interconnection structure claimed in claim 1, wherein said pin portions of said core members have center holes extending from top ends of said pin portions, respectively.

8. The interconnection structure claimed in claim 1, wherein each said core member has a plurality of pin portions.

9. A semiconductor device comprising: an LSI bare-chip; a plurality of pads disposed on a surface of said LSI bare-chip; and core members mounted on each of said pads, each of said core members comprising a pin portion having a tip portion, wherein an amount of solder is attached to each said core member, the amount of solder being selected such that said solder, when reflown, provides an hourglass-shaped configuration, and wherein the length of said pin portion is selected such that said tip portion is spaced from said second electronic part and when said solder is reflown, said tip portion is electrically connected to a second electronic part through said reflown solder.

* * * * *